United States Patent
Spencer et al.

(10) Patent No.: US 7,479,465 B2
(45) Date of Patent: Jan. 20, 2009

(54) TRANSFER OF STRESS TO A LAYER

(75) Inventors: Gregory S. Spencer, Pflugerville, TX (US); Venkat R. Kolagunta, Austin, TX (US); Narayanan C. Ramani, Austin, TX (US); Vishal P. Trivedi, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 194 days.

(21) Appl. No.: 11/460,748

(22) Filed: Jul. 28, 2006

(65) Prior Publication Data

US 2008/0026599 A1 Jan. 31, 2008

(51) Int. Cl.
*H01L 21/31* (2006.01)
*H01L 21/469* (2006.01)

(52) U.S. Cl. ............... 438/799; 438/308; 257/E21.475; 257/E21.241

(58) Field of Classification Search ................. 438/799, 438/791, 792, 308; 257/E21.241, E21.489, 257/E21.475
See application file for complete search history.

(56) References Cited

U.S. PATENT DOCUMENTS

| | | | |
|---|---|---|---|
| 4,549,064 A * | 10/1985 | Delfino | 219/121.85 |
| 7,030,428 B2 * | 4/2006 | Saxler | 257/194 |
| 7,135,392 B1 | 11/2006 | Adams et al. | |
| 7,145,219 B2 * | 12/2006 | Faris | 257/618 |
| 7,161,194 B2 * | 1/2007 | Parikh et al. | 257/194 |
| 7,223,647 B2 | 5/2007 | Hsu et al. | |
| 7,316,960 B2 * | 1/2008 | Ting | 438/301 |
| 2005/0233514 A1 | 10/2005 | Bu et al. | |
| 2005/0255667 A1 | 11/2005 | Arghavani et al. | |
| 2005/0258515 A1 | 11/2005 | Chidambarrao et al. | |
| 2005/0266639 A1 * | 12/2005 | Frohberg et al. | 438/257 |
| 2006/0014366 A1 | 1/2006 | Currie et al. | |
| 2006/0017138 A1 * | 1/2006 | Ting | 257/632 |
| 2006/0071285 A1 | 4/2006 | Datta et al. | |
| 2006/0131268 A1 * | 6/2006 | Mikhaylichenko et al. | 216/62 |
| 2006/0134899 A1 | 6/2006 | Wu et al. | |

(Continued)

OTHER PUBLICATIONS

Chen et al; "Stress memorization technique (SMT) by Selectively Strained-Nitride Capping for Sub-65nm High-Performance Strained-Si Device Application" 2004 Symposium on VLSI Technology Digest of Technical Papers pp. 56-57.

(Continued)

*Primary Examiner*—Caridad M Everhart
(74) *Attorney, Agent, or Firm*—James L. Clingan, Jr.; Daniel D. Hill

(57) ABSTRACT

A strained semiconductor layer is achieved by a method for transferring stress from a dielectric layer to a semiconductor layer. The method comprises providing a substrate having a semiconductor layer. A dielectric layer having a stress is formed over the semiconductor layer. A radiation anneal is applied over the dielectric layer of a duration not exceeding 10 milliseconds to cause the stress of the dielectric layer to create a stress in the semiconductor layer. The dielectric layer may then be removed. At least a portion of the stress in the semiconductor layer remains in the semiconductor layer after the dielectric layer is removed. The radiation anneal can be either by using either a laser beam or a flash tool. The radiation anneal can also be used to activate source/drain regions.

12 Claims, 5 Drawing Sheets

U.S. PATENT DOCUMENTS

| | | | |
|---|---|---|---|
| 2006/0223255 A1* | 10/2006 | Chen et al. | 438/199 |
| 2006/0223290 A1 | 10/2006 | Belyansky et al. | |
| 2006/0228897 A1* | 10/2006 | Timans | 438/758 |
| 2007/0141775 A1* | 6/2007 | Teo et al. | 438/231 |
| 2007/0148336 A1 | 6/2007 | Bachrach et al. | |
| 2007/0190741 A1* | 8/2007 | Lindsay | 438/424 |
| 2007/0281405 A1* | 12/2007 | Luo et al. | 438/183 |

OTHER PUBLICATIONS

Mishima et al; "Ultra-thin Strained Si on Insulator Substrate Using Laser Annealing" 2005 IEEE International SOI Conference pp. 141-143.

* cited by examiner

TRANSFER OF STRESS TO A LAYER

RELATED APPLICATIONS

This application is related to U.S. application Ser. No. 11/374,372, titled "Electronic Device and a Process for Forming the Electronic Device," filed Mar. 13, 2006, and assigned to the assignee hereof, and U.S. application Ser. No. 11/426,463, titled "Method for Straining a Semiconductor Device," filed Jun. 26, 2006, and assigned to the assignee hereof.

FIELD OF THE INVENTION

This invention relates generally to integrated circuits, and more particularly to transferring stress from one layer to another in an integrated circuit.

RELATED ART

One of the techniques that has been found to enhance transistor performance is to provide a semiconductor layer that has strain. The strain is effective because it increases carrier mobility. This is typically achieved by forming the strained semiconductor layer by epitaxial growth over a layer having a different composition. One such example is to grow a pure silicon layer over a silicon germanium layer. Another example is growing a silicon germanium layer over a silicon germanium layer with a different percentage of germanium. Similarly silicon germanium can be grown over silicon. These provide some effectiveness but also increase the semiconductor thickness and are time consuming because of the growth requirement.

Another approach has been to transfer the stress in an overlying layer, which may be sacrificial, to underlying amorphous source/drain regions. At the time of changing from amorphous to crystalline, the underlying source/drain regions become somewhat strained due to the stress of the overlying layer. One problem with this approach is that the amount of stress transferred to the underlying semiconductor layer is limited. Other issues include excessive heating and diffusion of source/drain dopants.

Thus, there is a need to provide an improved stress transfer technique.

BRIEF DESCRIPTION OF THE DRAWINGS

The present invention is illustrated by way of example, and not by way of limitation, in the figures of the accompanying drawings and in which like reference numerals refer to like elements and in which.

DESCRIPTION OF A PREFERRED EMBODIMENT

In one aspect, a stressed overlying dielectric layer transfers a resulting strain onto an underlying semiconductor layer. The transfer is effectuated using a directional radiation anneal such as a laser anneal or a flash anneal. The result is that more strain is transferred. The transferred strain also remains after the overlying layer is removed. This is generally important because the overlying layer will typically need to be removed. This has also been found to be effective for underlying semiconductor layers that are not amorphous. This can be beneficial because in such case the underlying semiconductor layer does not have to be converted to amorphous. This is better understood with reference to the FIGS. and the following description.

Figure 1:
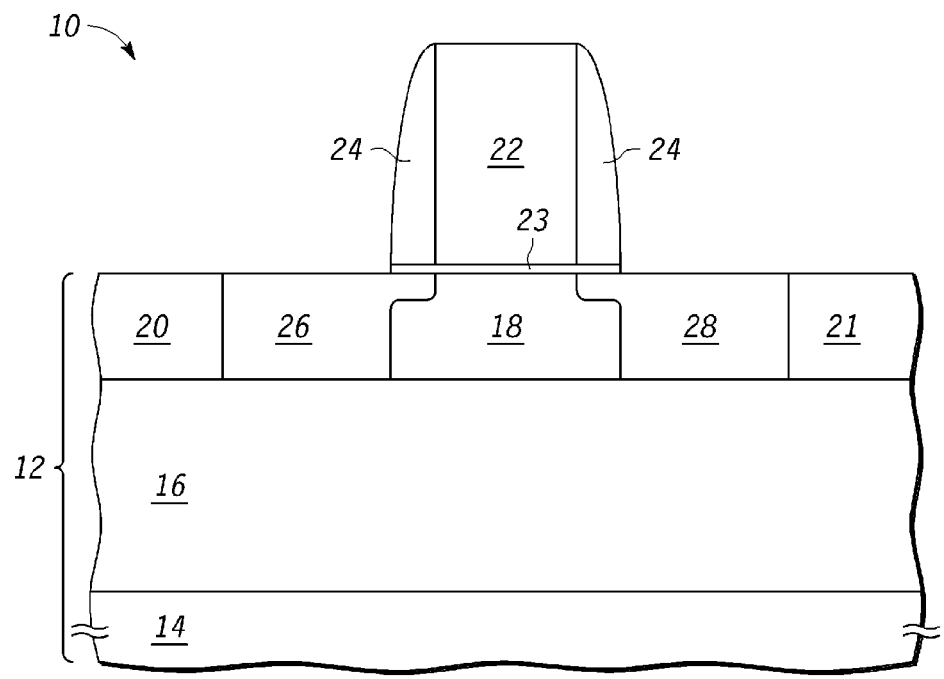
FIG. 1 is a cross section of a semiconductor device at a stage in a process according to one embodiment.

Shown in FIG. 1 is a semiconductor device 10 formed in and on a substrate 12. Substrate 12 has a supporting layer 14, an insulating layer 16 on supporting layer 14, and a semiconductor layer 18 on insulating layer 16. This is what is generally known as a semiconductor-on-insulator (SOI) substrate. Supporting layer 14 is typically silicon of relatively large thickness that provides physical support. Semiconductor layer 18 is also typically silicon that is comparatively thin, for example 700 Angstroms. Insulating layer 16 is typically oxide. As an alternative, SOI substrate 12 could be replaced by a bulk silicon substrate. On substrate 12 are a gate dielectric 23, a gate 22 on gate dielectric 23, a sidewall spacer 24 around gate 22, a source/drain region 26 substantially aligned to one edge of gate 22, a source/drain 28 aligned to another edge of gate 22. Source/drain regions 26 and 28 are formed in semiconductor layer 18. Also formed in semiconductor layer 18 are trench isolation regions 20 and 21 that are over and adjoin insulating layer 16. Isolation region 20 is adjacent to source/drain region 26. Isolation region 21 is adjacent to source/drain region 28. Gate 22 may be polysilicon or other conductor. Sidewall spacer may be a single a layer or combination of layers and may include a liner. At this stage, source/drain regions 26 and 28 have been implanted and at least portions thereof are amorphous. The amorphization of source/drain regions 26 and 28 may be sufficient from normal source/drain dopants such as boron, arsenic, or phosphorus. If that is not sufficient, an additional implant step using another species such as germanium, silicon, or xenon may be utilized. Also, sidewall spacers could be thinned or even removed to increase the stress transfer effects occurring in subsequent steps to be performed.

Figure 2:
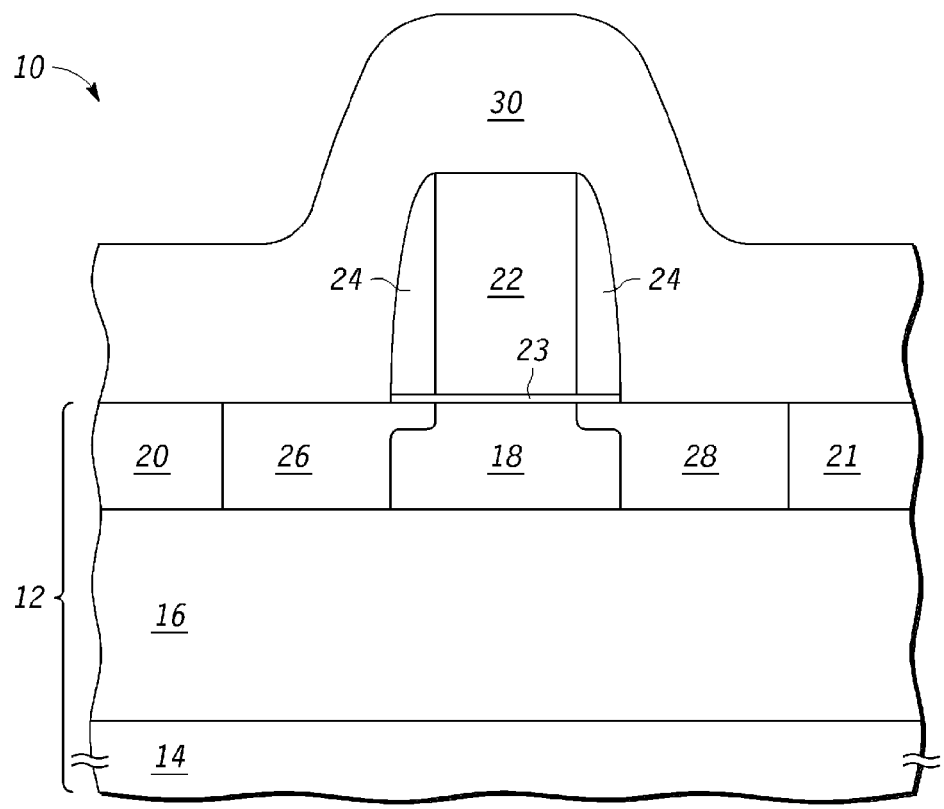
FIG. 2 is a cross section of the semiconductor device of FIG. 1 at subsequent stage in the process.

Shown in FIG. 2 is semiconductor device 10 after deposition of a dielectric layer 30. Dielectric layer 30 may be silicon nitride or another dielectric material that can be deposited with a desired stress. The thickness of dielectric layer 30 may be about 800 Angstroms and deposited by plasma-enhanced chemical vapor deposition (PECVD). The thickness can vary significantly; a range of 500 to 3000 Angstroms for example. PECVD allows for good control of the stress. PECVD nitride can be either tensile or compressive. But certain desired stresses may also be achieved by other deposition techniques and other dielectrics.

Figure 3:
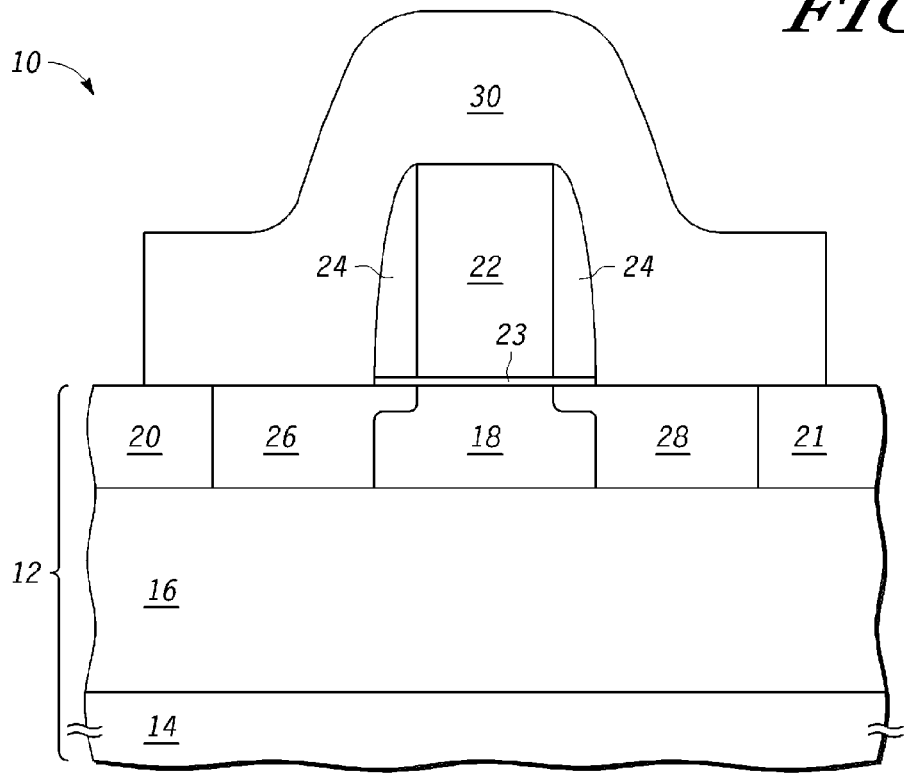
FIG. 3 is a cross section of the semiconductor device of FIG. 2 at subsequent stage in the process.

Shown in FIG. 3 is semiconductor device 10 after patterning dielectric layer 30. In this case, dielectric layer 30 is removed outside of trench isolation 20 and trench isolation 21 while being retained between trench isolation 20 and trench isolation 21. Dielectric layer 30 is in direct contact with most of the top surface of source/drain regions 26 and 28 but not with a channel region under gate 22. This is desirable for maximizing stress transfer to source/drain regions 26 and 28, but there may be situations where direct contact is either not feasible or undesirable for some other reason. This patterning may not always be needed. The patterning allows for adding stress to the semiconductor layer for one transistor type and leaving it unchanged for another type. This type of distinction is commonly desirable between P and N channel transistors. The type of stress that increases electron mobility for N channel transistors is normally different than for the stress that increases hole mobility for P channel transistors. There may be situations, however, where such a distinction is not desirable or at least not worth the patterning step.

Figure 4:
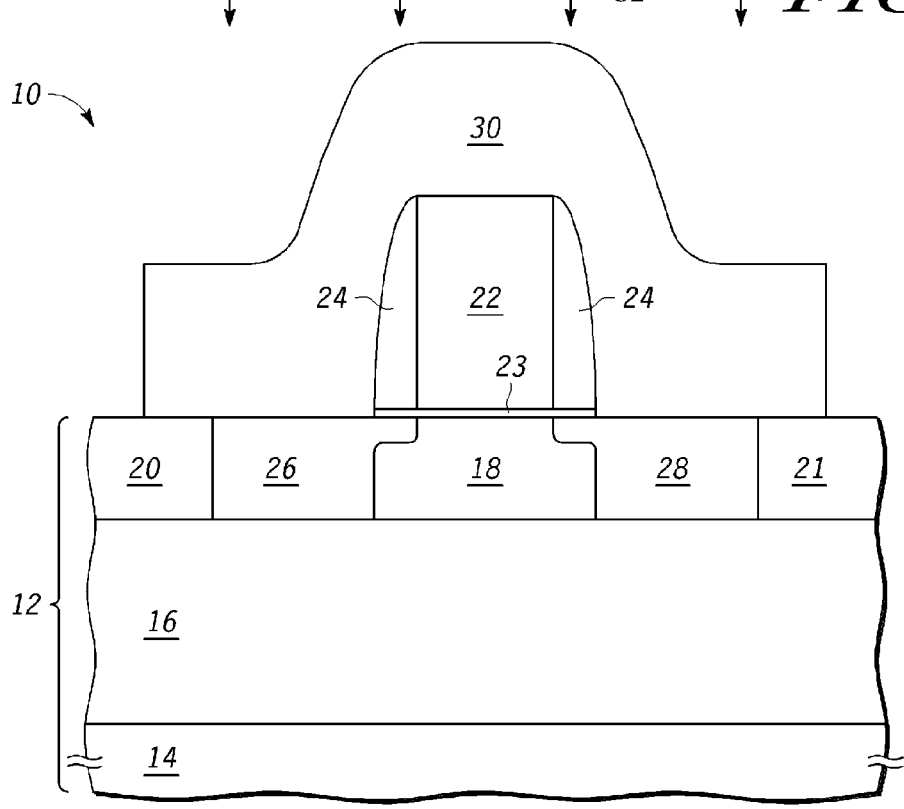
FIG. 4 is a cross section of the semiconductor device of FIG. 3 at subsequent stage in the process.

Shown in FIG. 4 is semiconductor device 10 with an application of a directional radiation anneal 32 of a duration not exceeding 10 milliseconds (ms). Laser and flash anneal are capable of this. The duration may be shorter, such as 1 ms, and be a peak temperature of 1200 to 1400 Celsius with semiconductor device 10 on a heated chuck. The chuck temperature may preferably be 400 degrees Celsius. A range of 375 to 450 degrees Celsius may also be effective. Although not believed to be necessary in this situation, it may be desirable to deposit an absorber layer for the directional radiation anneal.

Figure 5:
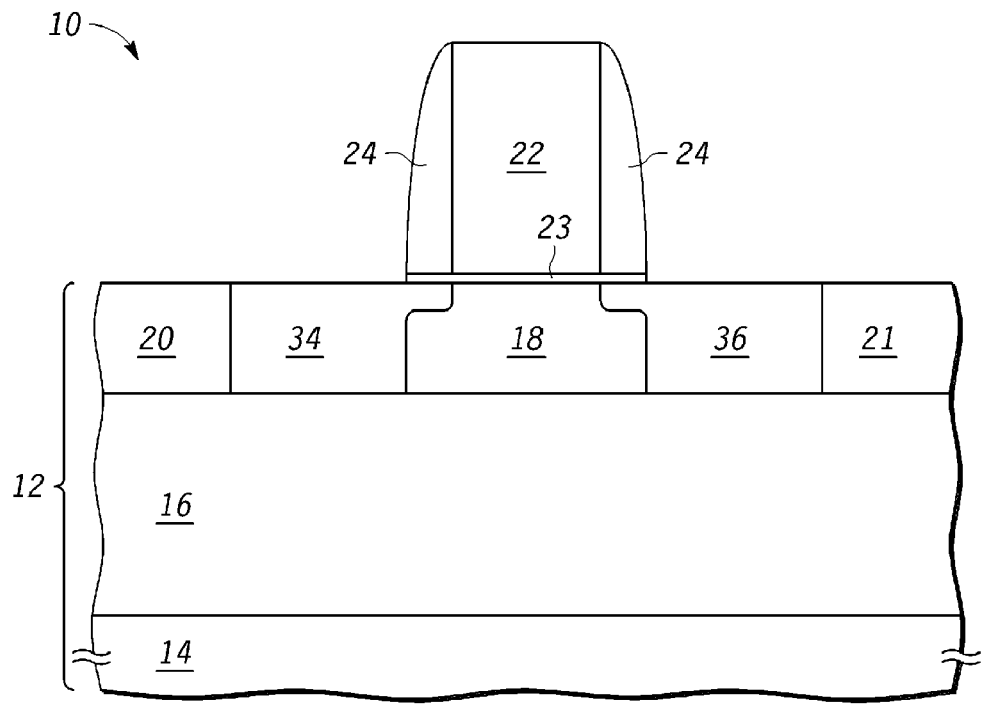
FIG. 5 is a cross section of a semiconductor device of FIG. 4 at subsequent stage in the process.

Shown in FIG. 5 is semiconductor device 10 after completion of directional radiation anneal, after source/drain regions 26 and 28 have become source/drains 34 and 36, and after the removal of dielectric layer 30. The change to source/drain regions 26 and 28 arises from transferring the stress of dielectric layer 30 and re-crystallizing achieved from directional radiation anneal 32. Source/drains 34 and 36 are activated and stressed. The stress transfer from dielectric layer 30 to source/drains 34 and 36 is measurably better than the stress transfer when using a rapid thermal anneal (RTA). Semiconductor device 10 is now a fully functional transistor. Source/drains 34 and 36 can be either P or N type and the stress of source/drains 34 and 36 can be either tensile or compressive based upon the stress of dielectric layer 30. There may be situations in which dielectric layer 30 may not need to be removed.

Figure 6:
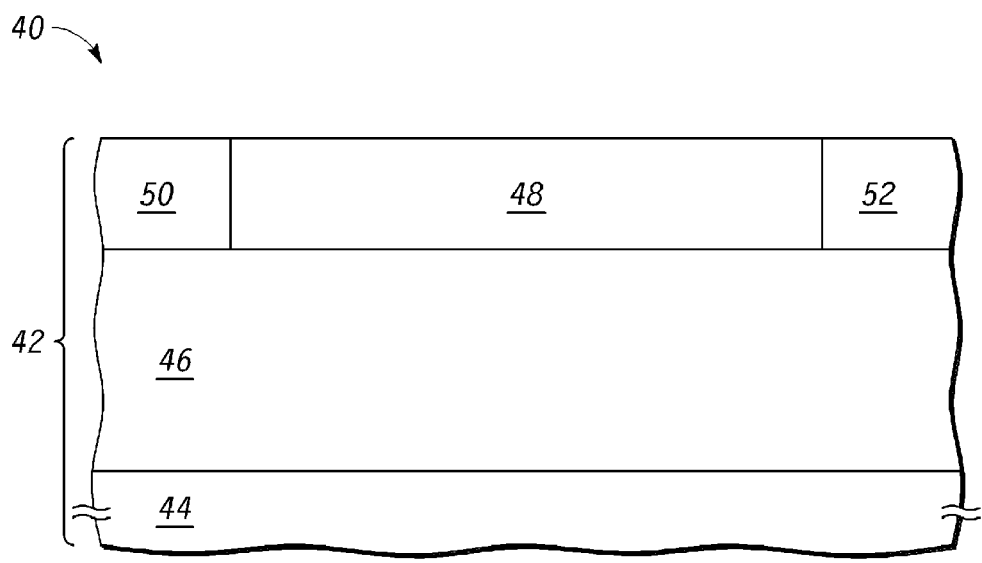
FIG. 6 is a cross section of a semiconductor device at a stage in a process according to another embodiment.

Shown in FIG. 6 is semiconductor device 40 comprising a substrate 42 having a supporting layer 44, an insulating layer 46 on supporting layer 44, and a semiconductor layer 48 on insulating layer 46 in which semiconductor layer 48 has formed therein a trench isolation 50 and a trench isolation 52. Substrate 42 is an SOI substrate similar to that of substrate 12. The primary difference is that semiconductor layer 48 is preferably thinner than 700 Angstroms. The thickness of semiconductor layer 48 may be in the range of 100 to 500 Angstroms. Semiconductor layer 48 may be crystalline rather than amorphous. In such case there is no amorphizing step. In some situations it may desirable to have a portion of semiconductor layer 48 be amorphous even though there is the disadvantage of increased processing due to the amorphization step that would be necessary to achieve that.

Figure 7:
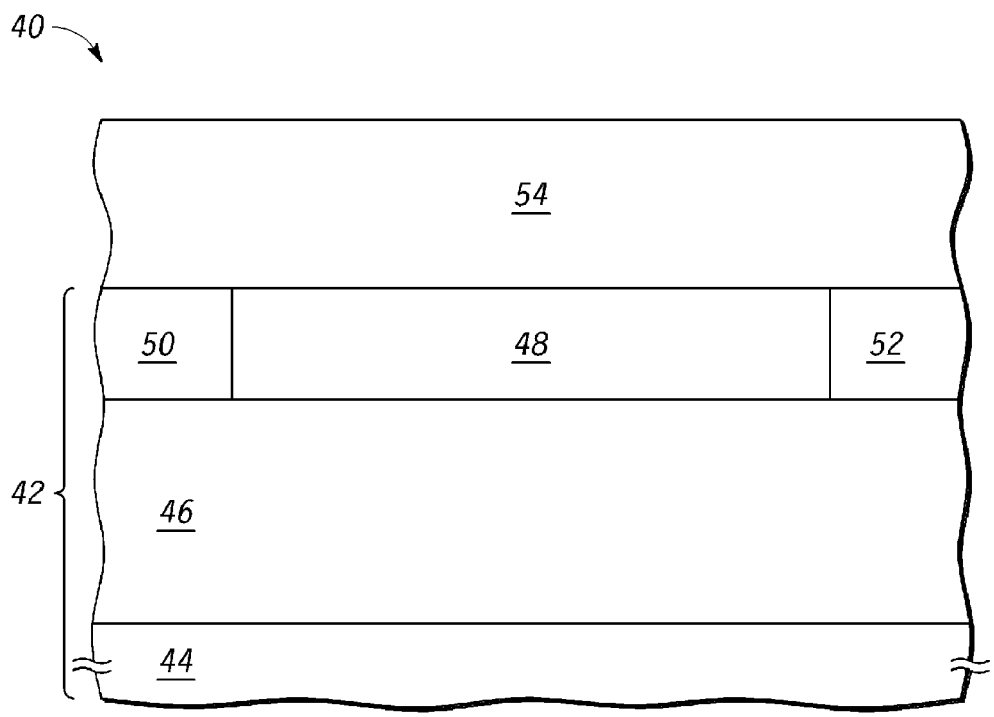
FIG. 7 is a cross section of the semiconductor device of FIG. 6 at subsequent stage in the process.
Figure 8:
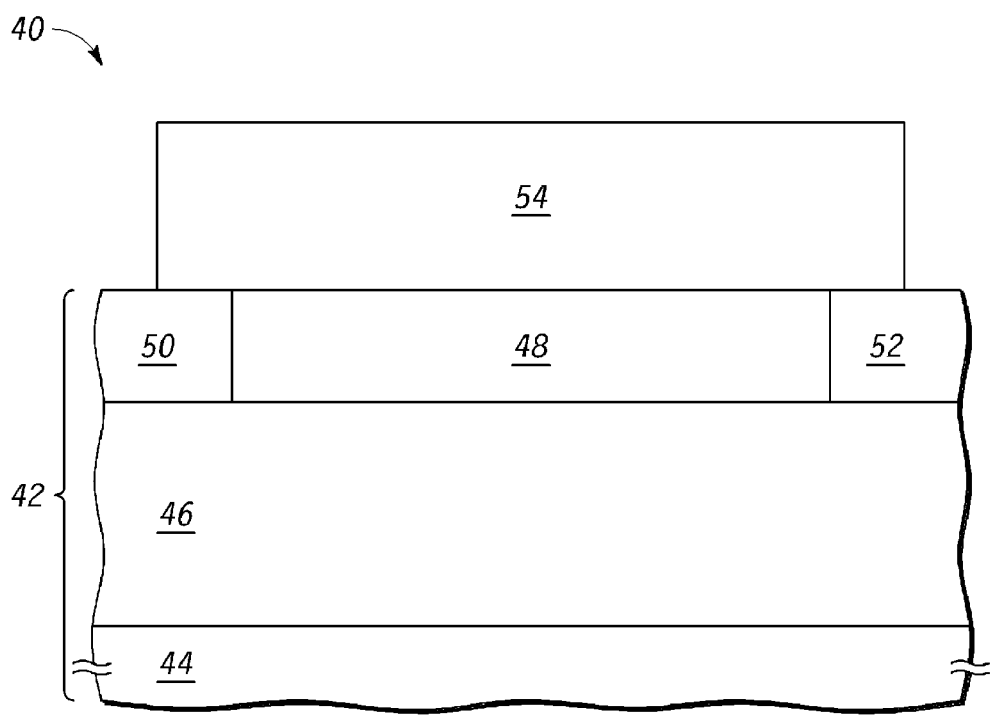
FIG. 8 is a cross section of the semiconductor device of FIG. 7 at subsequent stage in the process.

Shown in FIG. 7 is semiconductor device 40 after deposition of a dielectric layer 54. Dielectric layer 54 is similar to dielectric layer 30. In this case, however, dielectric layer 54 is preferably significantly thicker than semiconductor layer 48, whereas in the case of dielectric layer 30, it may be nearly the same as semiconductor layer Shown in FIG. 8 is after patterning dielectric layer 54. In this case, dielectric layer 54 is removed outside of trench isolation 50 and trench isolation 52 while being retained between trench isolation 50 and trench isolation 52. Dielectric layer 54 is shown in direct contact with semiconductor layer 48 between trench isolation 50 and trench isolation 52. This is desirable for maximizing stress transfer, but there may be situations where direct contact is either not feasible or undesirable for some other reason. This patterning may not always be needed. The patterning allows for adding stress to the semiconductor layer for one transistor type and leaving it unchanged for another type. This type of distinction is commonly desirable between P and N channel transistors. The type of stress that increases electron mobility for N channel transistors is normally different than for the stress that increases hole mobility for P channel transistors. There may be situations, however, where such a distinction is not desirable or at least not worth the patterning step.

Figure 9:
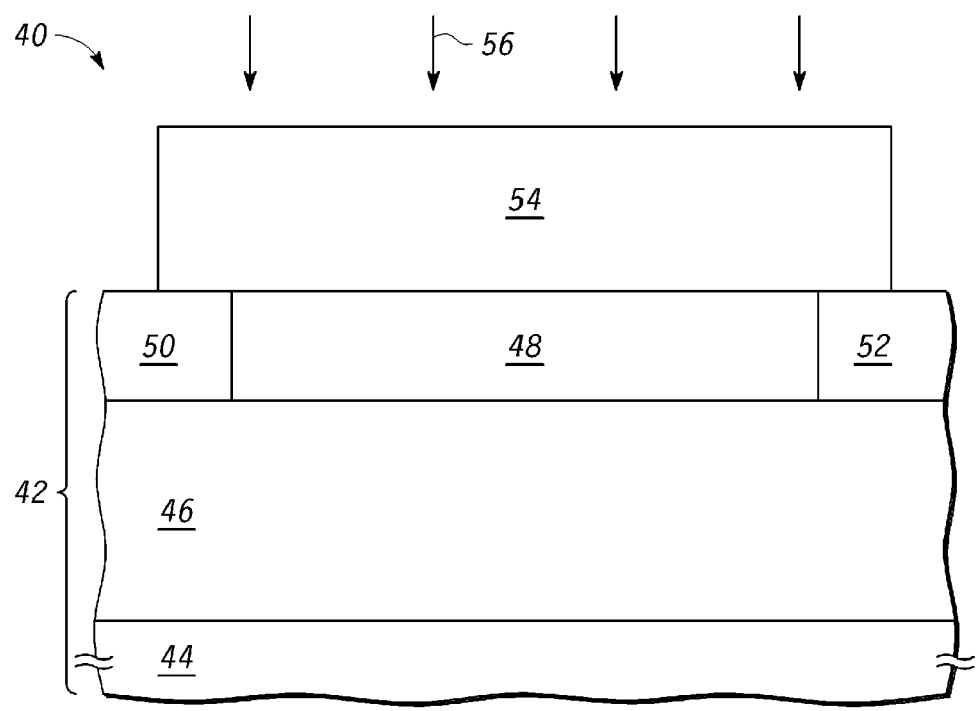
FIG. 9 is a cross section of the semiconductor device of FIG. 8 at subsequent stage in the process.

Shown in FIG. 9 is semiconductor device 40 with an application of a directional radiation anneal 56 for a duration that is less than 10 milliseconds (ms). Laser and flash anneal are capable of this. The duration may be shorter, such as 1 ms, and be a peak temperature of 1200 to 1400 Celsius with semiconductor device 10 on a heated chuck. The chuck temperature may be in a range of 375 to 450 degrees Celsius. Although not believed to be necessary in this situation of using silicon nitride as dielectric layer 54, it may be desirable to deposit an absorber layer for inhibiting reflection of the directional radiation anneal.

Figure 10:
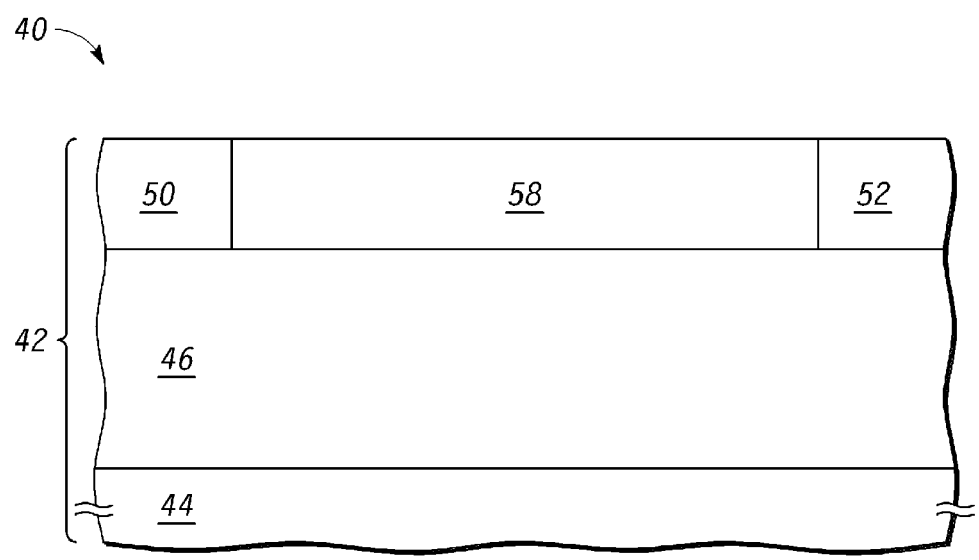
FIG. 10 is a cross section of the semiconductor device of FIG. 9 at subsequent stage in the process.

Shown in FIG. 10 is semiconductor device 40 after completion of directional radiation anneal, after semiconductor layer 48 has become semiconductor layer 58, and after the removal of dielectric layer 54. The change to semiconductor layer 48 arises from transferring the stress of dielectric layer 54. The stress transfer from dielectric layer 54 to semiconductor layer 48 is measurably better than the stress transfer when using a rapid thermal anneal (RTA). Semiconductor device 40 now has an active region, semiconductor layer 58 between trench isolation 50 and trench isolation 52. The stress of semiconductor layer 58 can be either tensile or compressive based upon the stress of dielectric layer 54. There may be situations in which dielectric layer 54, or portions thereof, may not need to be removed. As an alternative, the method for the stress transfer to the semiconductor layer as shown in FIGS. 6-10 would be completed prior to the formation of isolation regions 50 and 52.

Semiconductor device 40 of FIG. 10 is now usable for making transistors. One way this could be done is for semiconductor device 40 to be substituted for substrate 12 of FIG. 1. In such case semiconductor layer 18 would have a starting stress that would be altered in the source/drain regions. Although some relaxation is likely to occur in the channel, the channel would retain some of the original stress and the source/drain regions would be altered to achieve the desired source/drain stress. Another alternative is for semiconductor layer 58 of FIG. 10 to be used for one type of transistor, in which case the source/drains and channel would not necessarily have the stress further changed, and transistors of the other type would undergo the process of FIGS. 1-5 to have the source/drain stress be different from the channel stress.

Various changes and modifications to the embodiments herein chosen for purposes of illustration will readily occur to those skilled in the art. For example, different temperature ranges and thicknesses than those described may be found to be effective. To the extent that such modifications and variations do not depart from the spirit of the invention, they are intended to be included within the scope thereof which is assessed only by a fair interpretation of the following claims.

What is claimed is:

1. A method, comprising:
providing a substrate having a semiconductor layer;
forming a first dielectric layer having a first stress over the semiconductor layer;

applying a first radiation anneal over the first dielectric layer of a duration not exceeding 10 milliseconds to create a semiconductor layer having a second stress;

removing the first dielectric layer, wherein at least a portion of the second stress remains in the stressed semiconductor layer after the first dielectric layer is removed;

forming a gate electrode over the semiconductor layer;

forming first and second source/drain regions in the semiconductor layer;

forming a second dielectric layer having a third stress over the semiconductor layer; and applying a second radiation anneal over the second dielectric layer of a duration not exceeding 10 milliseconds to create a semiconductor layer having a fourth stress, wherein at least a portion of the fourth stress would remain in the semiconductor layer if the second dielectric layer were removed.

2. The method of claim 1, further comprising forming shallow trench isolation in the semiconductor layer prior to forming the first dielectric layer, wherein a first region is formed on one side of the shallow trench isolation and a second region is formed on another side of the shallow trench isolation, and wherein the first dielectric layer is formed over the first region and the second dielectric layer is formed over the second region.

3. The method of claim 1, wherein a portion of the semiconductor layer is made to be amorphous prior to applying the second radiation anneal.

4. The method of claim 1, wherein applying the first and second radiation anneals further comprises applying the first and second radiation anneals using a laser.

5. The method of claim 1, wherein a portion of the semiconductor layer is made amorphous prior to applying the radiation anneal by implanting one of germanium, silicon, and xenon.

6. The method of claim 1, wherein the semiconductor layer is substantially thinner than the first dielectric layer.

7. The method of claim 1, wherein forming the first dielectric layer further comprises forming the first dielectric layer by plasma-enhanced chemical vapor deposition (PECVD).

8. The method of claim 1, wherein the first dielectric layer comprises nitride, further comprising:

forming a sidewall spacer adjacent to the gate performing, prior to forming the second dielectric layer, one of a group of steps consisting of thinning the sidewall spacer and removing the sidewall spacer.

9. The method of claim 8, wherein applying the second radiation anneal further comprises applying the radiation using a laser.

10. The method of claim 1, wherein applying the first radiation anneal further comprises applying the radiation anneal to cause a peak temperature of 1200 to 1400 degrees Celsius in the dielectric layer.

11. The method of claim 10, further comprising patterning the first dielectric layer prior to applying the first radiation anneal.

12. The method of claim 11, further comprising:

forming shallow trench isolation in the semiconductor layer prior to forming the dielectric layer.

* * * * *